United States Patent
Liao et al.

(10) Patent No.: US 10,581,414 B2
(45) Date of Patent: Mar. 3, 2020

(54) SEMICONDUCTOR INTEGRATED CIRCUIT DEVICE

(71) Applicant: MediaTek Inc., Hsin-Chu (TW)

(72) Inventors: Chun-Neng Liao, New Taipei (TW); Meng-Hsin Chiang, Zhubei (TW); Chun-Wei Chang, Taipei (TW); Chee-Kong Ung, Hsinchu (TW); Ching-Chih Li, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 84 days.

(21) Appl. No.: 15/274,473

(22) Filed: Sep. 23, 2016

(65) Prior Publication Data
US 2017/0111032 A1   Apr. 20, 2017

Related U.S. Application Data

(60) Provisional application No. 62/241,240, filed on Oct. 14, 2015.

(51) Int. Cl.
| | | |
|---|---|---|
| H03K 5/1252 | (2006.01) | |
| H03H 7/06 | (2006.01) | |
| H01L 25/16 | (2006.01) | |
| H01L 23/64 | (2006.01) | |
| H03H 3/02 | (2006.01) | |

(52) U.S. Cl.
CPC ......... *H03K 5/1252* (2013.01); *H01L 23/642* (2013.01); *H01L 23/647* (2013.01); *H01L 25/16* (2013.01); *H01L 25/165* (2013.01); *H03H 3/02* (2013.01); *H03H 7/06* (2013.01); *H01L 2224/16227* (2013.01); *H01L 2924/15192* (2013.01); *H01L 2924/15311* (2013.01); *H01L 2924/19041* (2013.01); *H01L 2924/19043* (2013.01); *H01L 2924/19105* (2013.01)

(58) Field of Classification Search
CPC ..... H03K 5/1252; H01L 23/642; H01L 25/16; H01L 25/165; H03H 3/02; H03H 7/06
USPC .......................................................... 333/12
See application file for complete search history.

(56) References Cited

U.S. PATENT DOCUMENTS

| | | | |
|---|---|---|---|
| 5,543,756 A * | 8/1996 | Anderson | H03H 11/1208 330/306 |
| 8,952,792 B1 * | 2/2015 | Srinivas | H01Q 1/2208 340/10.1 |
| 8,988,046 B2 | 3/2015 | Yen | |
| 2006/0139123 A1 | 6/2006 | Tang | |
| 2007/0279882 A1 | 12/2007 | Weir et al. | |
| 2009/0184785 A1 * | 7/2009 | Zhao | H01P 1/22 333/81 R |
| 2011/0180898 A1 | 7/2011 | Tomishima et al. | |
| 2012/0081193 A1 | 4/2012 | Shirakawa et al. | |

(Continued)

FOREIGN PATENT DOCUMENTS

| | | |
|---|---|---|
| JP | 6175558 A | 4/1986 |
| TW | I423557 B | 1/2014 |

*Primary Examiner* — Stephen E. Jones
*Assistant Examiner* — Samuel S Outten
(74) *Attorney, Agent, or Firm* — Wolf, Greenfield & Sacks, P.C.

(57) ABSTRACT

A semiconductor integrated circuit device includes a chip main circuit, a damper and a passive component. The chip main circuit is coupled to a power source and performs a predetermined function. The damper is coupled to an output terminal of the chip main circuit. The passive component is coupled to the chip main circuit via the damper.

6 Claims, 9 Drawing Sheets

(56) References Cited

U.S. PATENT DOCUMENTS

2014/0055208 A1* 2/2014 Kondo ..................... H01P 7/10
                                                      333/12
2015/0207485 A1 7/2015 Hsu et al.

* cited by examiner

SEMICONDUCTOR INTEGRATED CIRCUIT DEVICE

CROSS REFERENCE TO RELATED APPLICATIONS

This application claims the benefit of U.S. Provisional Application No. 62/241,240 filed 2015 Oct. 14 entitled "Tunable External Decoupling Capacitor for Anti-resonance Suppression" the entire contents of which are hereby incorporated by reference.

BACKGROUND OF THE INVENTION

Field of the Invention

The invention relates to a semiconductor integrated circuit device, and more particularly to a semiconductor integrated circuit device with a tunable external decoupling capacitor for anti-resonance suppression.

Description of the Related Art

Anti-resonance is a pronounced minimum in the amplitude of a circuit at a particular frequency, accompanied by a large shift in its oscillation phase. Such a frequency is known as the system's anti-resonant frequency, and at this frequency, the amplitude of a signal can drop to almost zero.

FIG. 1 is a diagram showing an exemplary impedance profile of a system. The curve 101 represents a first capacitive impedance of a component, such as a printed circuit board (PCB), in the system. The curve 102 represents a second capacitive impedance of a component, such as a die, in the system. The curve 103 represents a first inductive impedance of a component, such as the PCB, in the system. The curve 104 represents a second inductive impedance of a component, such as the die, in the system.

When two curves intersect at a particular frequency, such as the frequency f1 shown in FIG. 1, the anti-resonance phenomenon occurs at the particular frequency and a shoulder 105 in the impedance profile is generated. Because the impedance increases enormously at the anti-resonant frequency f1, an undesired amplitude drop in the signal oscillating at the anti-resonant frequency f1 will occur and cause the performance of the system to suffer.

To suppress the undesired anti-resonance, a novel design for a semiconductor integrated circuit device is required.

BRIEF SUMMARY OF THE INVENTION

Semiconductor integrated circuit devices are provided. An exemplary embodiment of a semiconductor integrated circuit device comprises a chip main circuit, a damper and a passive component. The chip main circuit is coupled to a power source and performs a predetermined function. The damper is coupled to an output terminal of the chip main circuit. The passive component is coupled to the chip main circuit via the damper.

An exemplary embodiment of a semiconductor integrated circuit device comprises a chip main circuit and a damper. The chip main circuit is coupled to a power source and performs a predetermined function. The damper is coupled to an output terminal of the chip main circuit. The damper is coupled between the chip main circuit and a passive component for suppressing anti-resonance of the semiconductor integrated circuit device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
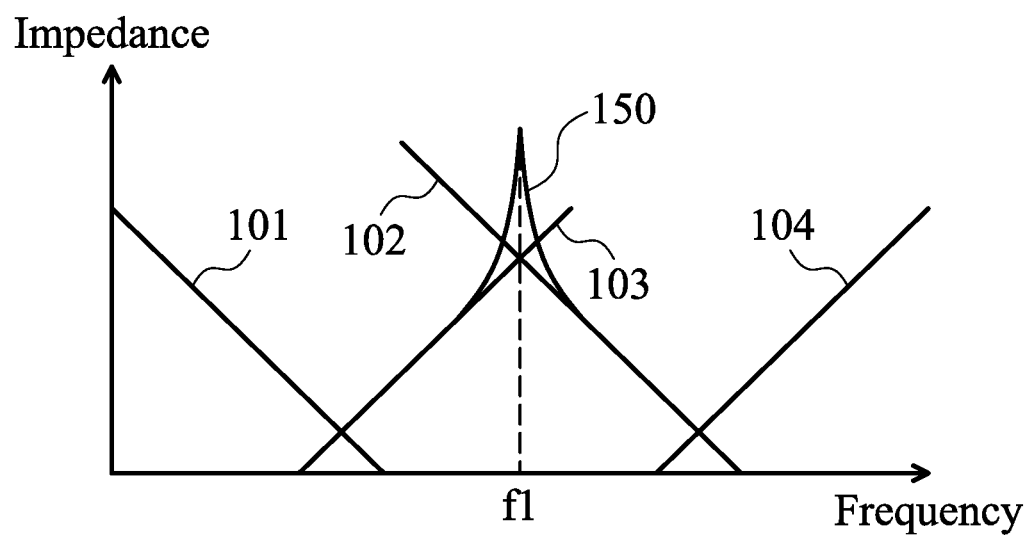
FIG. 1 is a diagram showing an exemplary impedance profile of a system.
Figure 2:
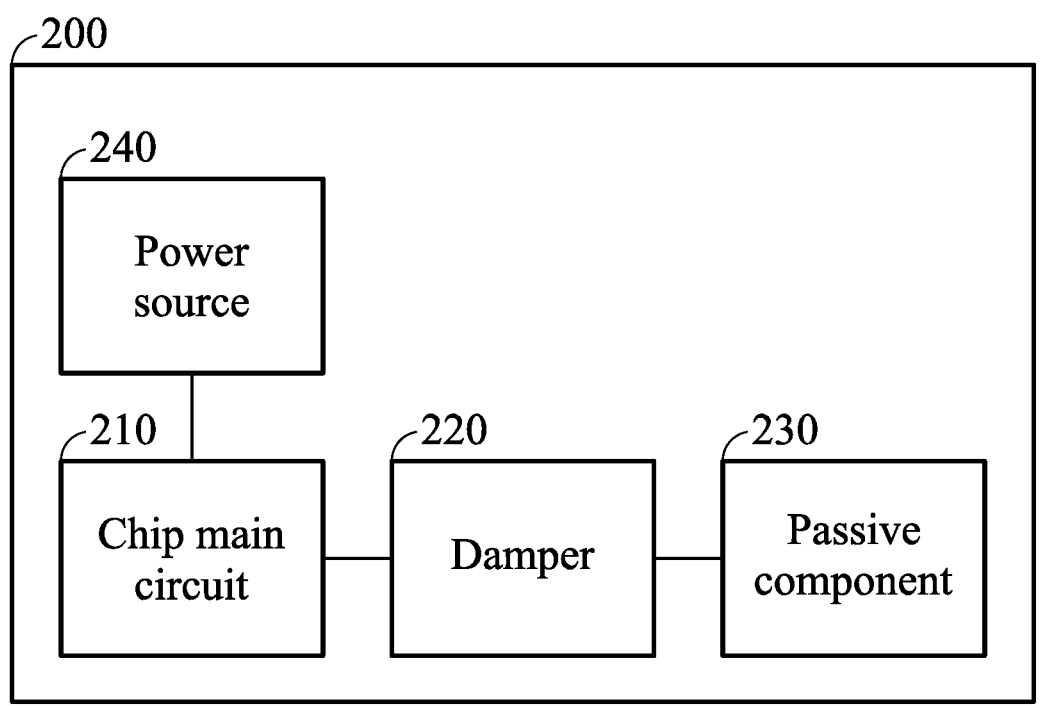
FIG. 2 shows an exemplary block diagram of a semiconductor integrated circuit device according to an embodiment of the invention.

FIG. 2 shows an exemplary block diagram of a semiconductor integrated circuit device according to an embodiment of the invention. The semiconductor integrated circuit device 200 may at least comprise a chip main circuit 210 and a damper 220. The chip main circuit 210 is coupled to a power source 240 and performs a predetermined function. For example, the chip main circuit 210 may perform a modem (that is, modulation and demodulation) function for wired/wireless communication, a signal processing function for wired/wireless communication, a digital signal processing function, an analog signal processing function, etc.

For providing the predetermined function, the chip main circuit 210 may be integrated in a chip such as a modem chip, a baseband signal processing chip, an RF signal processing chip, a digital signal processing chip, an analog signal processing chip, etc. The power source 240 may be configured inside or outside of the chip. In addition, the power source 240 may be configured inside or outside of the chip main circuit 210.

The damper 220 is coupled to an output terminal OUT of the chip main circuit 210.

The semiconductor integrated circuit device 200 may further comprise a passive component 230. The damper 220 is coupled between the chip main circuit 210 and the passive component 230. In other words, in an embodiment of the invention, the passive component 230 is coupled to the chip main circuit 210 via the damper 220.

According to an embodiment of the invention, the passive component 230 is in an independent path that is not directly connected to the power source 240, regardless of whether the power source 240 is configured inside or outside of the chip main circuit 210 or the chip.

In addition, according to an embodiment of the invention, the damper 220 is coupled between the chip main circuit 210 and the passive component 220 for suppressing anti-resonance of the semiconductor integrated circuit device 200.

In addition, in the embodiments of the invention, the damper 220 and the passive component 230 are the circuit components external to the chip main circuit 210, as shown in FIG. 2. In other words, the predetermined function performed by the chip main circuit 210 is not affected by the damper 220 and the passive component 230. The chip main circuit 210 can perform the predetermined function even if the damper 220 and the passive component 230 are not coupled thereto or do not even exist in the semiconductor integrated circuit device 200. The damper 220 and the passive component 230 are introduced to decrease the impedance and suppress anti-resonance of the semiconductor integrated circuit device 200.

According to an embodiment of the invention, the chip main circuit 210, the damper 220 and the passive component 230 may be packed in a package and/or mounted on a printed circuit board (PCB). Therefore, in some embodiments of the invention, the semiconductor integrated circuit device 200 may further comprise a package and/or a PCB.

Figure 3:
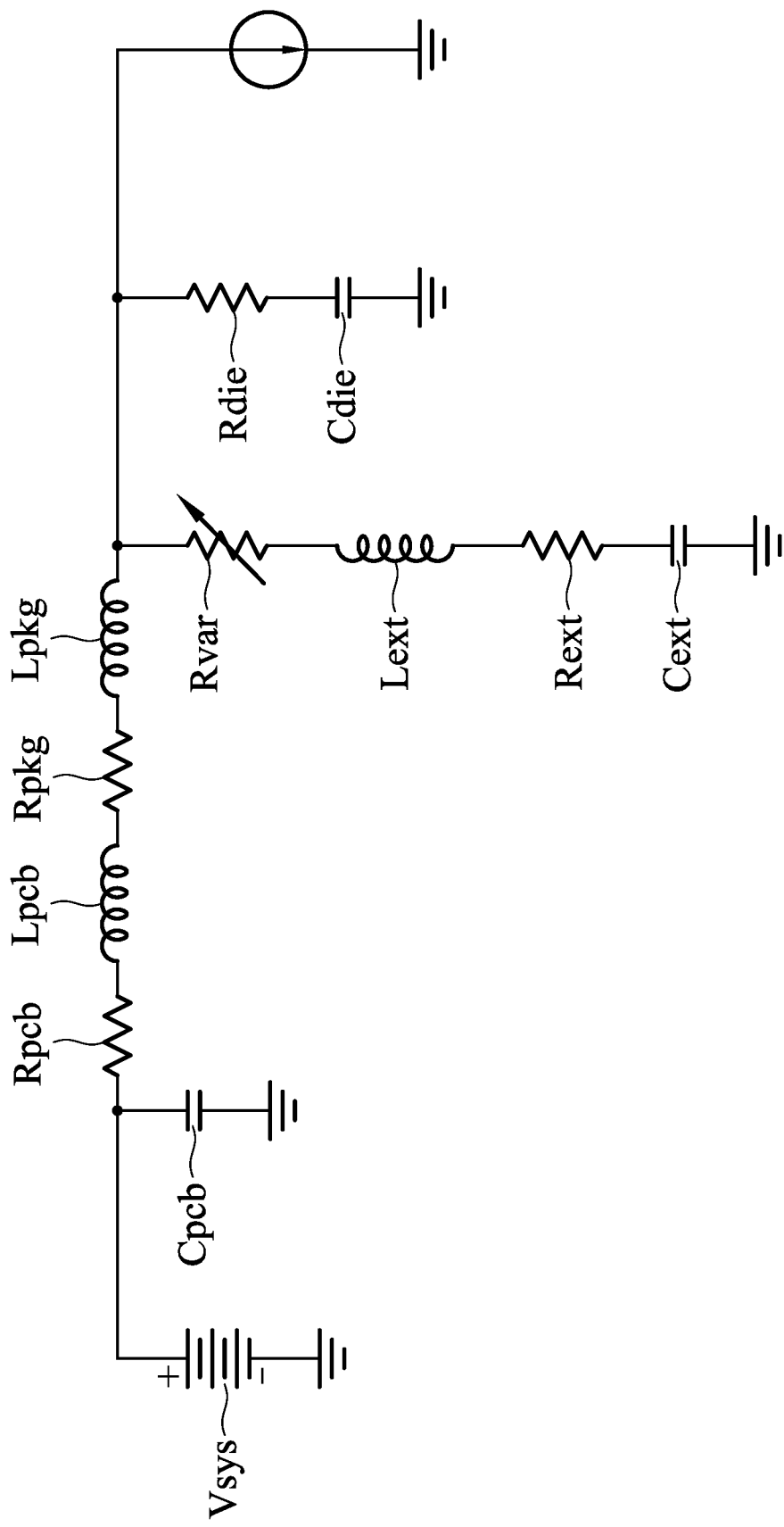
FIG. 3 is an equivalent circuit diagram of an electronic system comprising the semiconductor integrated circuit device according to an embodiment of the invention.

FIG. 3 is an equivalent circuit diagram of an electronic system comprising the semiconductor integrated circuit device according to an embodiment of the invention. The capacitor Cpcb represents the equivalent capacitor of the PCB. The inductor Lpcb represents the equivalent inductor of the PCB. The resistor Rpkg represents the equivalent resistor of the package. The inductor Lpkg represents the equivalent inductor of the package. The resistor Rdie represents the equivalent resistor of a chip with the chip main circuit 210 integrated therein. The capacitor Cdie represents the equivalent capacitor of the chip with the chip main circuit 210 integrated therein.

The capacitor Cext represents the equivalent capacitor of the passive component 230. The inductor Lext represents the parasitic inductor of the passive component 230. The resistor Rext represents the parasitic resistor of the passive component 230. The resistor Rvar represents the equivalent resistor of the damper 220.

The capacitor Cext, the inductor Lext and the resistor Rext may be as a whole regarded as the overall impedance contributed by the passive component 230. According to an embodiment of the invention, the damper 220 and the passive component 230 are coupled in serial.

As shown in FIG. 3, the passive component 230 is not directly connected to the power source Vsys of the electronic system and is coupled to the chip (that is, the chip main circuit 210) via the damper 220.

According to an embodiment of the invention, the resistance of the damper 220 may be adjustable, so as to be adjusted to an optimal value for suppressing anti-resonance of the semiconductor integrated circuit device 200.

Figure 4:
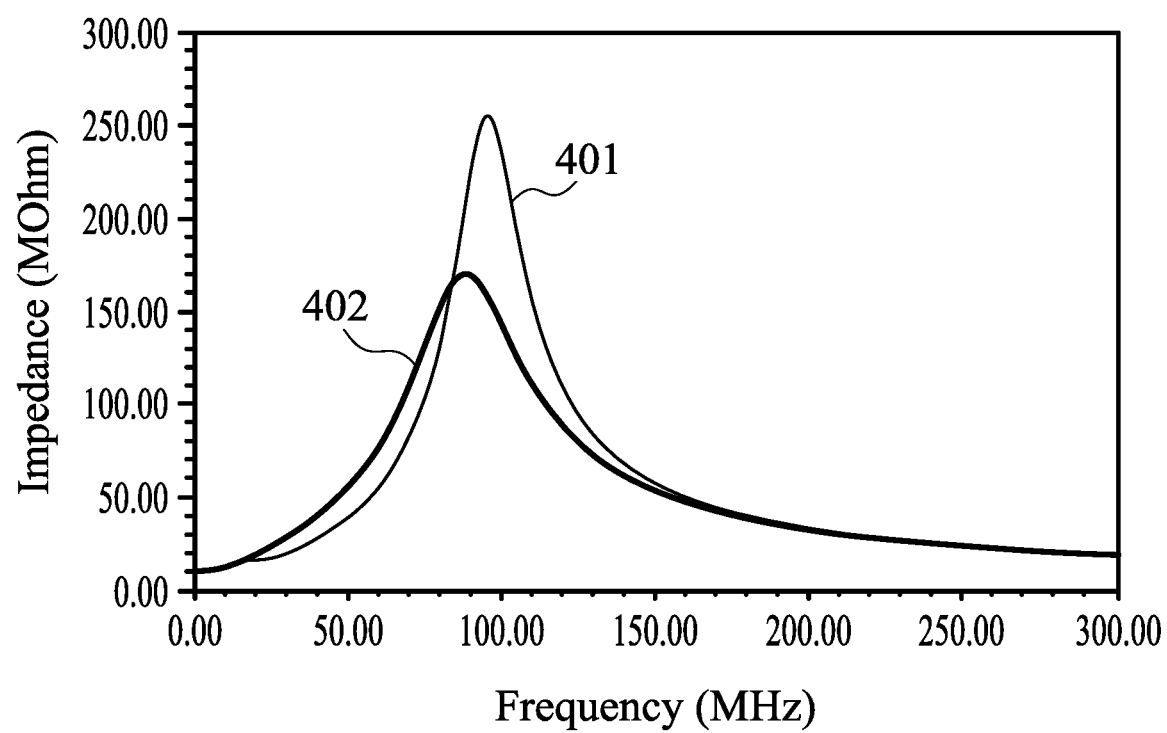
FIG. 4 is a diagram showing an exemplary impedance profiles of the electronic system according to an embodiment of the invention.

FIG. 4 is a diagram showing exemplary impedance profiles of the electronic system according to an embodiment of the invention. FIG. 4 shows the impedance profiles of the shoulder generated when anti-resonance occurs. The curve 401 represents the impedance profile of the shoulder when the damper 220 is not added. The curve 402 represents the impedance profile of the shoulder when the damper 220 is added to the electronic system as shown in FIG. 2 and FIG. 3. As shown in FIG. 4, when the damper 220 is added, the shoulder becomes wider and the peak amplitude of the shoulder is decreased.

According to an embodiment of the invention, the damper 220 is a variable resistor. The resistance of the resistor may be adjusted to an optimal value for suppressing anti-resonance of the semiconductor integrated circuit device 200.

According to an embodiment of the invention, the passive component 230 is a capacitor.

Figure 5A:
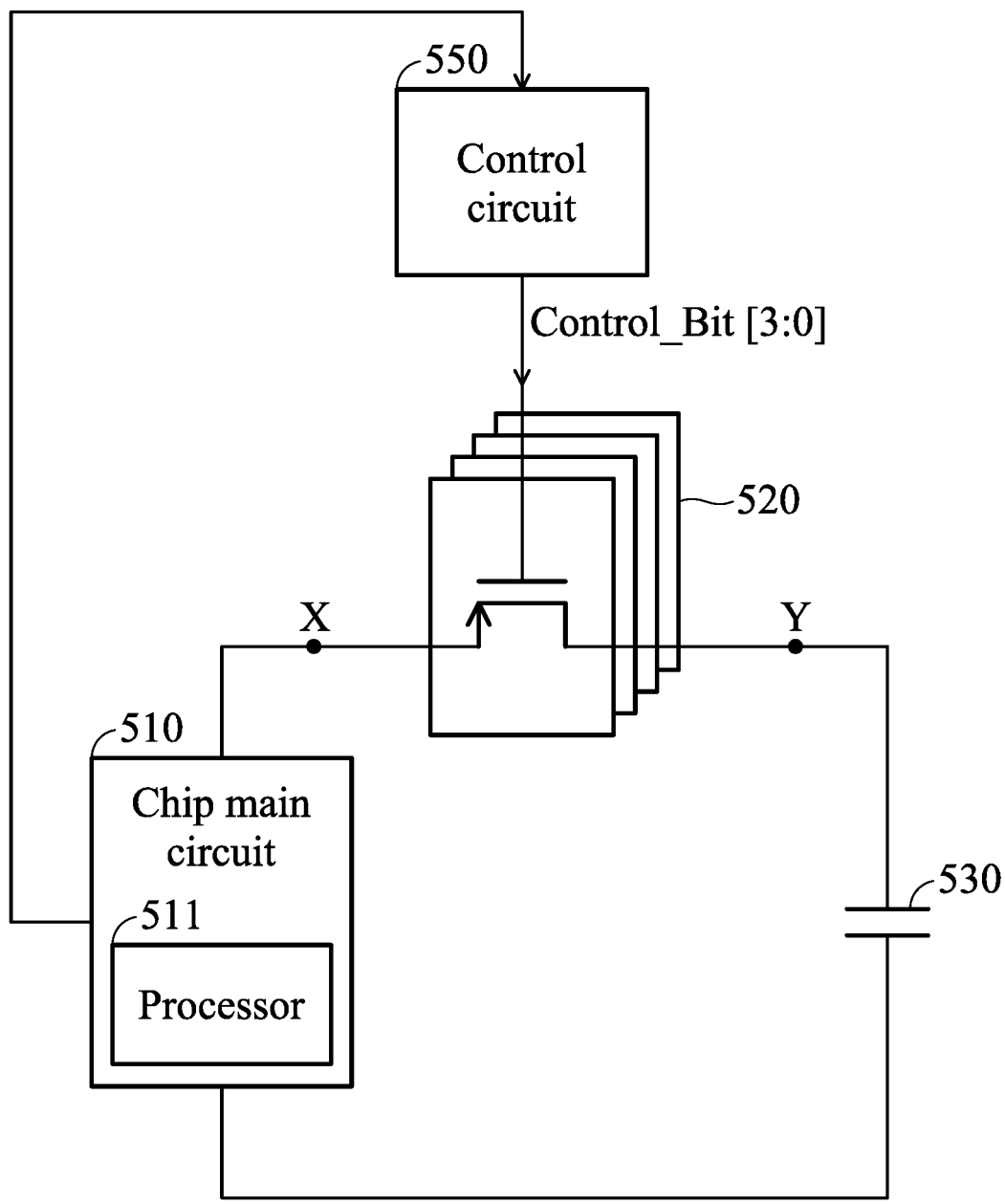
FIG. 5A shows an exemplary circuit diagram of a semiconductor integrated circuit device according to an embodiment of the invention.

FIG. 5A shows an exemplary circuit diagram of a semiconductor integrated circuit device according to an embodiment of the invention. The variable resistor 520 is coupled between the chip main circuit 510 and the capacitor 530. The capacitor 530 may be regarded as an external decoupling capacitor of the chip main circuit 510. The semiconductor integrated circuit device 500 may further comprise a control circuit 550 generating a multi-bit control signal Control Bit for controlling the resistance of the variable resistor 520 (that is, the damper). Note that in some embodiments, the control circuit 550 may also be integrated in the chip main circuit 510, or may be implemented by any device in the chip main circuit 510. Therefore, the invention should not be limited to the architecture shown in FIG. 5A.

In the embodiment, the variable resistor 520 may be implemented by a plurality of transistors coupled in parallel. For example, as an exemplary circuit diagram shown in FIG. 5B, the variable resistor may be implemented by four transistors with a first electrode coupled to the terminal X, a second electrode coupled to the terminal Y and a control electrode receiving the corresponding control signal B1~B4 carried in the multi-bit control signal Control Bit. When the transistor is turned on in response to the corresponding control signal, the transistor is equivalent to a resistor or resistive device. For example, the multi-bit control signal [0000] may correspond to the minimum resistance provided by the variable resistor 520, and the multi-bit control signal [1110] may correspond to the maximum resistance provided by the variable resistor 520.

Figure 5B:
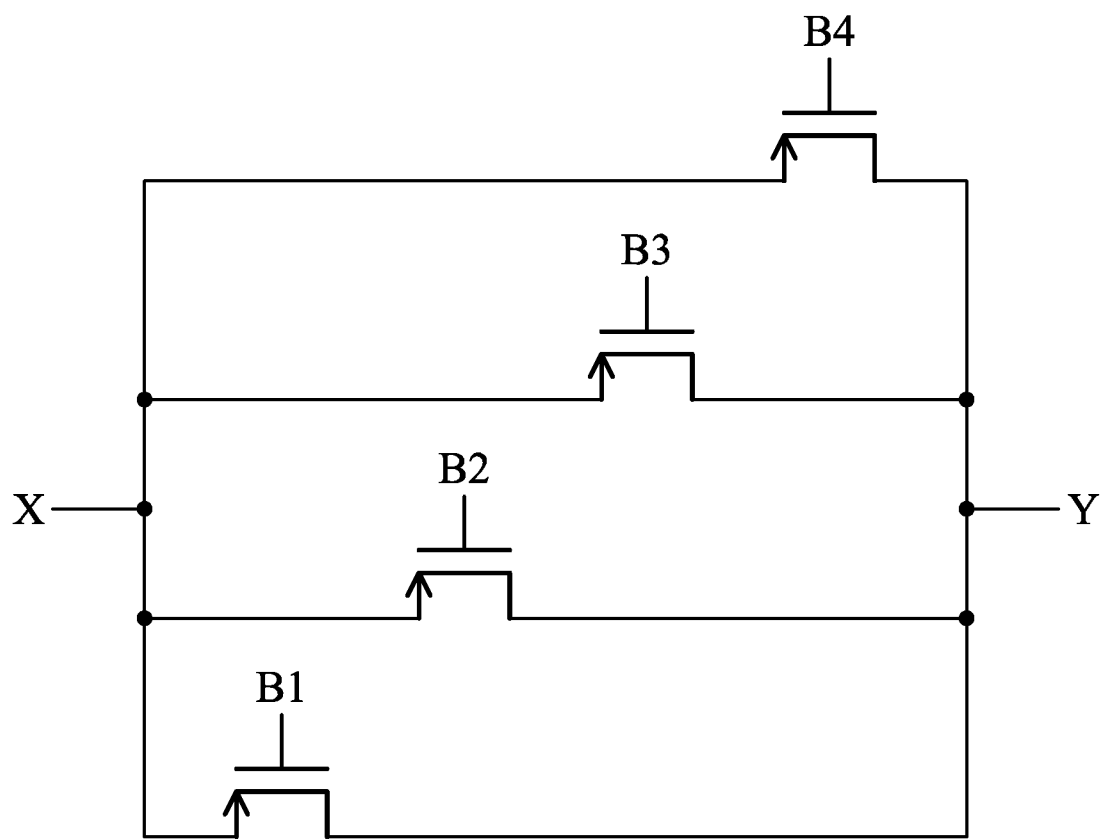
FIG. 5B shows an exemplary circuit diagram of a variable resistor according to an embodiment of the invention.

Note that, although there are four transistors or resistive devices shown in FIG. 5B to implement the variable resistor, the invention should not be limited thereto. The variable resistor may also be implemented by less than or more than four transistors, resistive devices, resistors, or inductors.

According to an embodiment of the invention, the chip main circuit 510 may comprise a processor 511. The processor 511 may determine the optimal resistance of the variable resistor 520 (that is, the damper) by searching for the minimum system voltage provided by the power source (such as the power source 240 or Vsys) of the electronic system for the chip main circuit 510, the semiconductor integrated circuit device, or even the electronic system being able to function without crashing, and generate a control signal for controlling the resistance of the variable resistor 520 (that is, the damper) according to the optimal resistance. The control signal may be provide to the control circuit 550 and the control circuit 550 generates the multi-bit control signal Control Bit according to the control signal as shown in FIG. 5, or may be directly provided to the variable resistor 520 for controlling the resistance thereof.

For example, in an embodiment of the invention, suppose that there are n values of resistance R1-Rn that can be provided by the variable resistor 520. For each resistance, the processor 511 may first search for a corresponding minimum system voltage, such as Vmin_R1, Vmin_R2 . . . Vmin_Rn, provided by the power source of the electronic system for the chip main circuit 510, the semiconductor integrated circuit device, or even the electronic system to be able to function without crashing, and then compare the minimum system voltages Vmin_R1, Vmin_R2 . . . Vmin_Rn to obtain the smallest one among them. The resistance corresponding to the smallest one may be determined to be the optimal resistance.

Figure 6:
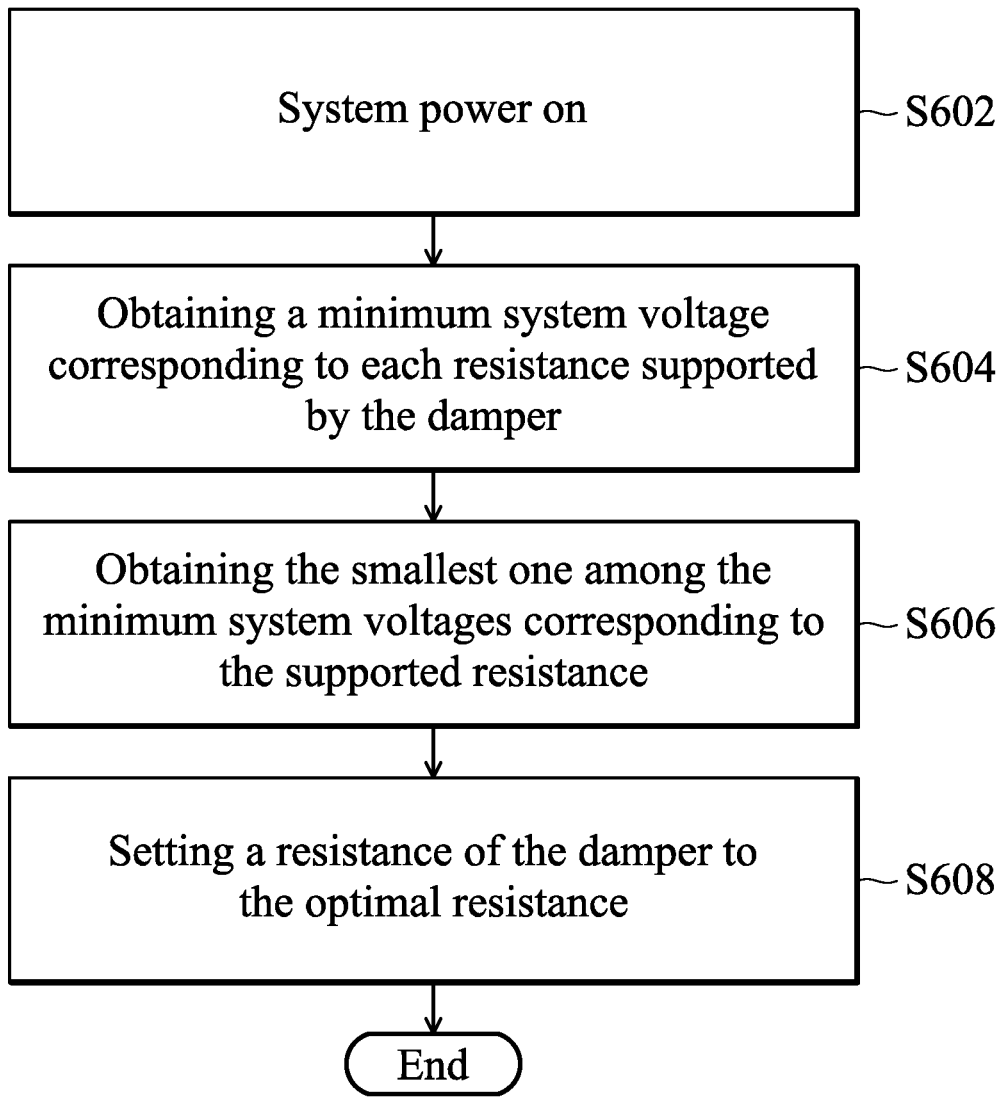
FIG. 6 is a flow chart of a method for determining the optimal resistance of the damper according to an embodiment of the invention.

FIG. 6 is a flow chart of a method for determining the optimal resistance of the damper according to an embodiment of the invention. When the electronic system powers on (that is, when the power source supplies power) (Step S602), the chip main circuit boots up and the processor generates control signals to control the resistance of the damper (for example, the variable resistor). The system voltage provided by the power source is adjusted to multiple levels as well for every possible resistance supported by the damper, to test whether the electronic system can function normally or not under each level of system voltage, and obtain the minimum system voltage that the electronic system is able to function on without crashing, corresponding to each resistance supported by the damper (Step S604). Next, the processor obtains the smallest of the minimum system voltages corresponding to the supported resistance (Step S606). The resistance corresponding to the smallest one is determined to be the optimal resistance. Next, the processor generates a control signal for setting the resistance of the damper to the optimal resistance (Step S608).

According to an embodiment of the invention, the chip main circuit, the damper and the passive component may be integrated in a chip.

Figure 7:
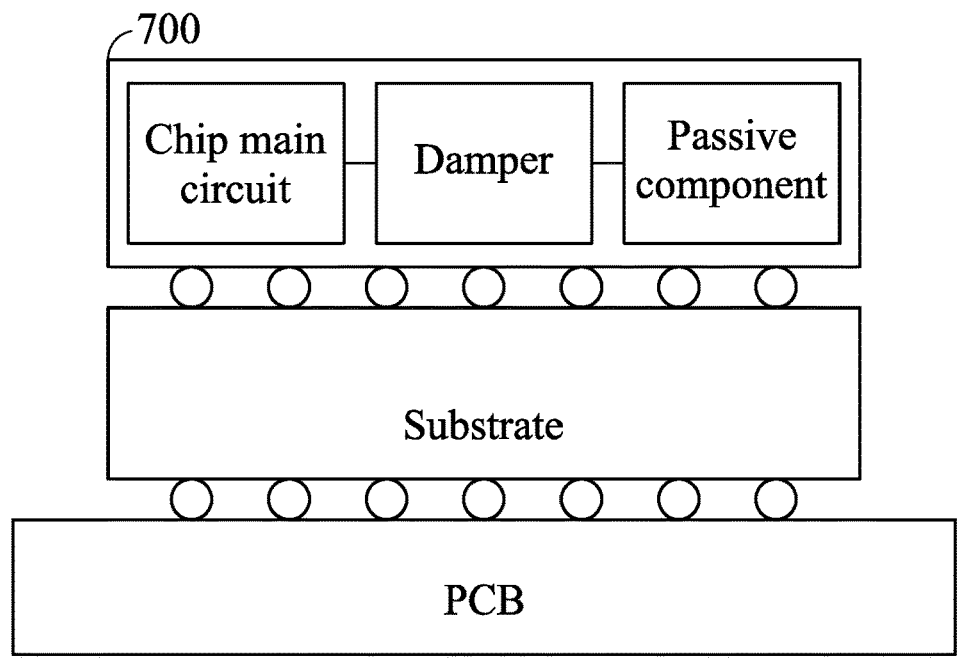
FIG. 7 shows an exemplary lateral view of an electronic system according to an embodiment of the invention.

FIG. 7 shows an exemplary lateral view of an electronic system according to an embodiment of the invention. In this embodiment, the chip main circuit, the damper (for example, a variable resistor) and the passive component (for example, an external decoupling capacitor) may be integrated in a chip 700. The chip 700 may be packed in the substrate as shown.

According to another embodiment of the invention, the chip main circuit and the damper may be integrated in a chip, and the passive component may be configured outside of the chip.

Figure 8:
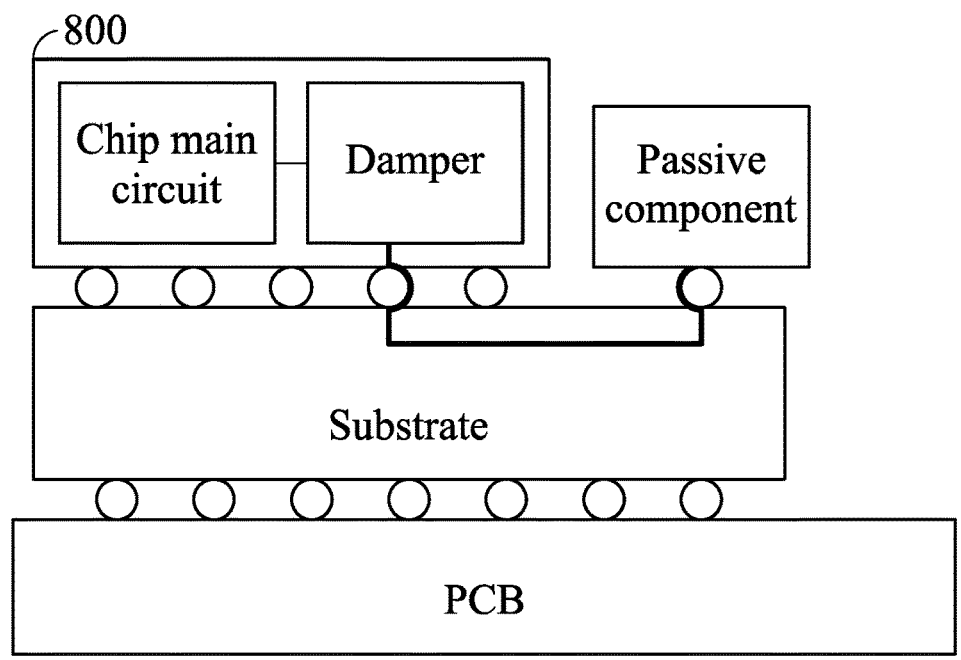
FIG. 8 shows an exemplary lateral view of an electronic system according to another embodiment of the invention.

FIG. 8 shows an exemplary lateral view of an electronic system according to another embodiment of the invention. In this embodiment, the chip main circuit and the damper (for example, a variable resistor) may be integrated in a chip 800, and the passive component (for example, an external decoupling capacitor) may be configured outside of the chip 800. The chip 800 may be packed in the substrate as shown, and the passive component may be coupled to the damper via a trace.

According to yet another embodiment of the invention, the chip main circuit may be integrated in a chip, and the damper and the passive component may be configured outside of the chip.

Figure 9:
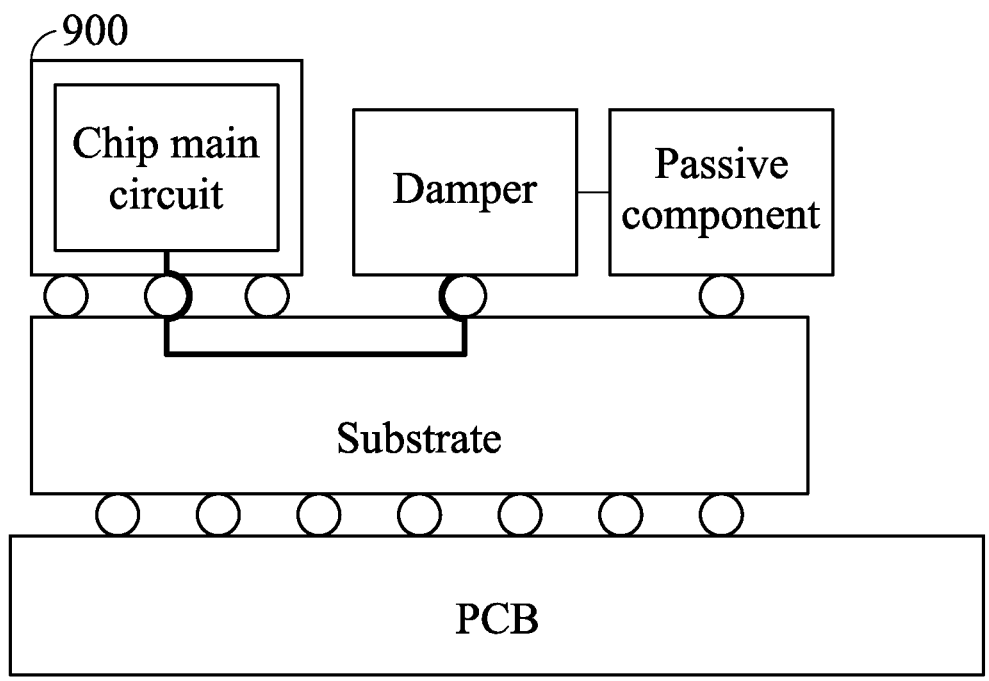
FIG. 9 shows an exemplary lateral view of an electronic system according to another embodiment of the invention.

FIG. 9 shows an exemplary lateral view of an electronic system according to another embodiment of the invention. In this embodiment, the chip main circuit may be integrated in a chip 900, and the damper (for example, a variable resistor) and the passive component (for example, an external decoupling capacitor) may be configured outside of the chip 900. The chip 900 may be packed in the substrate as shown, and the damper and the passive component may be coupled to the damper via a trace.

Note that, in some embodiments of the invention, the damper and the passive component may also be integrated as one device, and the invention should not be limited to the embodiments as illustrated above. For example, the damper (for example, a variable resistor) may be implemented in the passive component (for example, an external decoupling capacitor).

As described above, in the embodiments of the invention, with the damper 220 and the passive component 230, the impedance and the anti-resonance of the semiconductor integrated circuit device or the electronic system can be effectively decreased and suppressed.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A semiconductor integrated circuit device, comprising:
a chip main circuit, coupled to a power source and performing a predetermined function;
a damper, coupled to an output terminal of the chip main circuit, wherein the damper is a variable resistor having multiple specific resistances; and
a passive component, coupled to the chip main circuit via the damper;
wherein the chip main circuit comprises a processor, the processor determines an optimal resistance of the damper by searching for a minimum system voltage provided by the power source for the semiconductor integrated circuit device to be able to function normally based on one of the specific resistances and selecting the smallest one among the minimum system voltages corresponding to the specific resistances, and generates a control signal for controlling resistance of the damper according to the optimal resistance.

2. The semiconductor integrated circuit device as claimed in claim 1, wherein the passive component is a capacitor.

3. The semiconductor integrated circuit device as claimed in claim 1, wherein the predetermined function comprises a modem function, a signal processing function, a digital signal processing function, or an analog signal processing function.

4. A semiconductor integrated circuit device, comprising:
a chip main circuit, coupled to a power source and performing a predetermined function; and
a damper, coupled to an output terminal of the chip main circuit, wherein the damper is a variable resistor having multiple specific resistances,
wherein the damper is coupled between the chip main circuit and a passive component for suppressing anti-resonance of the semiconductor integrated circuit device;
wherein the chip main circuit comprises a processor, the processor determines an optimal resistance of the damper by searching for a minimum system voltage provided by the power source for the semiconductor integrated circuit device to be able to function normally based on one of the specific resistances and selecting the smallest one among the minimum system voltages corresponding to the specific resistances, and generates a control signal for controlling resistance of the damper according to the optimal resistance.

5. The semiconductor integrated circuit device as claimed in claim 4, wherein the passive component is a capacitor.

6. The semiconductor integrated circuit device as claimed in claim 4, wherein the predetermined function comprises a modem function, a signal processing function, a digital signal processing function, or an analog signal processing function.

\* \* \* \* \*